(12) United States Patent
Cheng et al.

(10) Patent No.: US 7,611,931 B2
(45) Date of Patent: Nov. 3, 2009

(54) SEMICONDUCTOR STRUCTURES WITH BODY CONTACTS AND FABRICATION METHODS THEREOF

(75) Inventors: Kangguo Cheng, Guilderland, NY (US); Ramachandra Divakaruni, Ossining, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 11/928,135

(22) Filed: Oct. 30, 2007

(65) Prior Publication Data

US 2008/0050873 A1 Feb. 28, 2008

Related U.S. Application Data

(62) Division of application No. 11/216,395, filed on Aug. 31, 2005.

(51) Int. Cl.
*H01L 21/8242* (2006.01)

(52) U.S. Cl. .................. 438/152; 438/241; 438/243; 257/E21.652

(58) Field of Classification Search .................. 438/242
See application file for complete search history.

(56) References Cited

U.S. PATENT DOCUMENTS

| | | | |
|---|---|---|---|
| 4,630,237 A | 12/1986 | Miura et al. | |
| 4,704,368 A | 11/1987 | Goth et al. | |
| 5,477,071 A | 12/1995 | Hamamoto et al. | |
| 5,606,188 A | 2/1997 | Bronner et al. | |
| 5,729,039 A | 3/1998 | Beyer et al. | |
| 5,795,813 A | 8/1998 | Hughes et al. | |
| 5,930,605 A | 7/1999 | Mistry et al. | |
| 6,071,791 A | 6/2000 | Hughes et al. | |
| 6,156,607 A | 12/2000 | Noble et al. | |
| 6,333,532 B1 | 12/2001 | Davari et al. | |
| 6,426,252 B1 | 7/2002 | Radens et al. | |

(Continued)

OTHER PUBLICATIONS

Rosmeulen et al., "Electrical Characterisation of Silicon-Rich-Oxide Based Memory Cells Using Pulsed Current-Voltage Techniques", Sep. 2002, Solid-State Device Research Conference, 2002. Proceeding of the 32nd European, pp. 471-474.

(Continued)

*Primary Examiner*—Stephen W Smoot
(74) *Attorney, Agent, or Firm*—Wood, Herron & Evans, LLP

(57) ABSTRACT

A semiconductor structure for a dynamic random access memory (DRAM) cell array that includes a plurality of vertical memory cells built on a semiconductor-on-insulator (SOI) wafer and a body contact electrically coupling a semiconductor body and a semiconductor substrate of the SOI wafer. The semiconductor body includes a channel region for the access device of one of the vertical memory cells. The body contact, which extends through a buried dielectric layer of the SOI wafer, provides a current leakage path that reduces the impact of floating body effects upon the vertical memory cell. The body contact may be formed by etching a via that extends through the semiconductor body and buried dielectric layer of the SOI wafer and extends into the substrate and partially filling the via with a conductive material that electrically couples the semiconductor body with the substrate.

15 Claims, 10 Drawing Sheets

U.S. PATENT DOCUMENTS

| | | | |
|---|---|---|---|
| 6,437,388 | B1 | 8/2002 | Radens et al. |
| 6,492,233 | B2 | 12/2002 | Forbes et al. |
| 6,500,710 | B2 | 12/2002 | Nakagawa |
| 6,509,613 | B1 | 1/2003 | En et al. |
| 6,521,938 | B2 | 2/2003 | Hamamoto |
| 6,531,375 | B1 | 3/2003 | Giewont et al. |
| 6,555,446 | B1 | 4/2003 | Unnikrishnan |
| 6,566,177 | B1 | 5/2003 | Radens et al. |
| 6,570,208 | B2 | 5/2003 | Mandelman et al. |
| 6,576,945 | B2 | 6/2003 | Mandelman et al. |
| 6,593,205 | B1 | 7/2003 | Chen et al. |
| 6,593,612 | B2 | 7/2003 | Gruening et al. |
| 6,724,047 | B2 | 4/2004 | Unnikrishnan |
| 6,794,716 | B2 | 9/2004 | Park et al. |
| 6,812,114 | B2 | 11/2004 | Chen et al. |
| 6,825,545 | B2 | 11/2004 | Nasr |
| 6,867,083 | B2 | 3/2005 | Imam et al. |
| 6,913,968 | B2 | 7/2005 | Cheng et al. |
| 6,940,130 | B2 | 9/2005 | Bryant et al. |
| 6,964,897 | B2 | 11/2005 | Bard et al. |
| 2004/0046201 | A1* | 3/2004 | Noble .................. 257/301 |
| 2004/0238868 | A1 | 12/2004 | Arnold et al. |
| 2004/0248363 | A1* | 12/2004 | Bard et al. .............. 438/243 |
| 2004/0250221 | A1* | 12/2004 | Bard et al. .............. 716/1 |
| 2005/0085096 | A1 | 4/2005 | Low et al. |
| 2006/0175660 | A1 | 8/2006 | Cheng et al. |
| 2006/0202249 | A1 | 9/2006 | Cheng et al. |
| 2007/0045697 | A1 | 3/2007 | Cheng et al. |
| 2007/0045698 | A1 | 3/2007 | Cheng et al. |
| 2008/0044959 | A1 | 2/2008 | Cheng et al. |

OTHER PUBLICATIONS

Maiti, et al., "Low-Pressure Chemical-Vapor-Deposited Silicon-Rich Oxides for Nonvolatile Memory Applications", Dec. 1992, IEEE Electron Device Letters, vol. 13, Issue 12, pp. 624-626.

Office Action issued in related U.S. Appl. No. 11/216,395; dated as mailed on Mar. 19, 2008; 16 pages; USPTO.

Office Action issued in related U.S. Appl. No. 11/216,395; dated as mailed on Sep. 25, 2007; 19 pages; USPTO.

Office Action issued in related U.S. Appl. No. 11/216,395; dated as mailed on Mar. 15, 2007; 19 pages; USPTO.

Office Action issued in related U.S. Appl. No. 11/216,386; dated as mailed on Sep. 8, 2008; 12 pages; USPTO.

Office Action issued in related U.S. Appl. No. 11/216,386; dated as mailed on Mar. 13, 2008; 12 pages; USPTO.

Office Action issued in related U.S. Appl. No. 11/216,386; dated as mailed on Oct. 9, 2007; 16 pages; USPTO.

Office Action issued in related U.S. Appl. No. 11/216,386; dated as mailed on Mar. 26, 2007; 17 pages; USPTO.

Office Action issued in related U.S. Appl. No. 11/216,395; dated as mailed on Oct. 7, 2008; 18 pages; USPTO.

Mandelman, et al., "Floating-Body Concerns for SOI Dynamic Random Access Memory (DRAM)", Oct. 1996 IEEE International SOI Conference (2 pages), pp. 136-137.

Mandelman, et al., "Challenges and Future Directions for the Scaling of Dynamic Random-Access Memory (DRAM)", IBM J. Res. & Dev. vol. 46 No. 2/3 Mar./May 2002 pp. 187-212.

Office Action issued in related U.S. Appl. No. 11/925,352; dated as mailed on Nov. 19, 2008; 11 pages; USPTO.

Notice of Allowance issued in related U.S. Appl. No. 11/925,352; dated as mailed on Jun. 8, 2009.

Final Office Action issued in related U.S. Appl. No. 11/216,386; dated as mailed on Feb. 23, 2009.

Hsin Yi Hsieh (Examiner); Office Action issued in related U.S. Appl. No. 11/216,395; dated as mailed on Aug. 7, 2009.

* cited by examiner

SEMICONDUCTOR STRUCTURES WITH BODY CONTACTS AND FABRICATION METHODS THEREOF

CROSS-REFERENCE TO RELATED APPLICATIONS

This application is a divisional of application Ser. No. 11/216,395, filed Aug. 31, 2005, which is hereby incorporated by reference herein in its entirety.

This application is related to commonly-assigned application Ser. No. 11/216,386, filed on even date herewith, entitled "BODY-CONTACTED SEMICONDUCTOR STRUCTURES AND METHODS OF FABRICATING SUCH BODY-CONTACTED SEMICONDUCTOR STRUCTURES", which is hereby incorporated by reference herein in its entirety.

FIELD OF THE INVENTION

The invention relates generally to semiconductor structures and, in particular, to semiconductor structures with multiple vertical memory cells arranged to form a memory array and methods of forming such semiconductor structures.

BACKGROUND OF THE INVENTION

Dynamic random access memory (DRAM) devices are the most commonly used type of semiconductor memory and, thus, are found in many integrated circuit designs. DRAM devices are also frequently embedded into application specific integrated circuits, such as processors and logic devices. A generic DRAM device includes a plurality of substantially identical semiconductor memory cell arrays, a plurality of bit lines, and a plurality of word lines that intersect the bit lines. Each memory cell array includes a plurality of memory cells arranged in rows and columns. Each individual memory cell in the array is located at the intersection of one of the word lines and one of the bit lines.

Each individual memory cell includes a storage capacitor for storing data and an access device, such as a planar or vertical metal oxide semiconductor field-effect transistor (MOSFET), for allowing the transfer of data charges to and from the storage capacitor during reading and writing operations. Either the source or drain of the access device is connected to a corresponding bit line and the gate of the access device is connected to a corresponding word line. In certain DRAM device designs, memory cells are arranged in pairs to allow sharing of a bit line contact, which significantly reduces the overall memory cell size.

When the access device of one of the memory cells is activated by a signal on the word line, a data signal is transferred from the storage capacitor of the memory cell to the bit line connected to the memory cell or from the bit line connected to the memory cell to the storage capacitor of the memory cell. Because DRAM devices are a type of volatile memory that leaks stored charge, the data charge on the storage capacitor (corresponding to a "1" or "0") is periodically refreshed during a refresh operation.

When data stored in one of the memory cells is read onto one of the bit lines, a potential difference is generated between the bit line of the respective memory cell and the bit line of another memory cell, which form a bit line pair. A bit line sense amplifier connected to the data line pair senses and amplifies the potential difference and transfers the data from the selected memory cells to a data line pair.

One goal of memory device designers is to pack more memory cells more densely into a smaller integrated circuit. Vertical memory cells feature an architecture in which the storage capacitor and access device are stacked vertically in a common trench. Vertical memory cells afford increased packing densities and other advantages in comparison to planar memory cells, in which size reduction was realized in the past primarily by reduction of the linear dimensions (i.e., the minimum lithographic feature size, F). For example, the packing density of vertical memory cells in a DRAM device is increased because the length of the vertical access device channel region is decoupled from the minimum lithographic feature size. Consequently, vertical memory cells lack the scaling problems with, for example, reducing the gate-oxide thickness and increasing the channel doping concentration encountered when scaling planar access devices to smaller sizes. The vertical memory cell architecture also allows longer channel lengths without a proportional decrease in memory density, as is true in planar memory cells. Channel length may also be properly scaled in vertical memory cells relative to gate oxide thickness and relative to junction depth to reduce channel doping, minimize junction leakage, and increase data retention times.

Constructing DRAM devices using semiconductor-on-insulator (SOI) technology offers many advantages over counterpart devices built in bulk semiconductor substrates including, but not limited to, higher performance, absence of latch-up, higher packing density, and low voltage applications. In SOI technology, a thin semiconductor layer, often referred to as an SOI layer, is electrically isolated from a thicker semiconductor substrate by an insulating or dielectric material, e.g., a buried oxide or BOX layer. The access devices for the memory cells are built in an SOI body defined as an electrically-isolated section of the SOI layer.

Floating body effects occur in vertical memory cells built using SOI technology. SOI technology eliminates junction capacitance problems observed in comparable bulk devices by electrically isolating the SOI body of transistor-type access devices from the underlying semiconductor material of the substrate. However, the SOI body may float at a potential that varies according to various conditions in which the transistor-type access device is operated.

Floating body effects are known to significantly degrade cell data retention time, which is most evident in long data retention time memory cells. Floating body effects originate from the accumulation of charge carriers in the channel region of the access device defined in the SOI body. A resultant leakage current is established via a parasitic bipolar transistor structure arising from the accumulated charge carriers. If uncompensated, the leakage current gradually discharges the storage capacitor. Floating body effects also cause fluctuations in the threshold voltage for the memory cell arising from the charge build up, which is extremely detrimental to the operation of transistor-type access devices.

What is needed, therefore, is a semiconductor structure for an SOI DRAM cell array and a DRAM device with improved cell data retention times and methods of fabricating such semiconductor structures that overcome the disadvantages of conventional semiconductor structures and conventional methods of manufacturing such semiconductor structures, respectively.

SUMMARY OF THE INVENTION

The present invention is generally directed to a semiconductor-on-insulator (SOI) structure that incorporates a body contact extending through the buried dielectric layer and, thereby, coupling an SOI body with an underlying semiconductor substrate and methods of forming such body contacts. The structure improves the cell data retention time for a vertical memory cell in an SOI dynamic random access memory (DRAM) device by reducing floating body effects that, if uncompensated, may affect the memory cell access device and result in charge loss from the associated storage capacitor in the vertical memory cell. Specifically, charge carriers that would otherwise accumulate in the channel region of the access device are drained or discharged through a leakage path, which may be high electrical resistance, defined by the body contact that extends to the underlying semiconductor substrate.

In accordance with one aspect of the present invention, a semiconductor structure comprises a semiconductor wafer including a semiconductor substrate, a semiconductor layer with a plurality of semiconductor bodies, a buried dielectric layer separating the semiconductor substrate from the semiconductor layer, and a plurality of memory cells built in an array on the semiconductor wafer. Each of the memory cells includes a storage capacitor and an access device. The access device has a vertical channel region defined in one of the semiconductor bodies and a gate configured to switch current flow through the vertical channel region to the storage capacitor. The structure further comprises a body contact of an electrically conductive material extending through the buried dielectric layer. The body contact has a first end electrically connected with one of the semiconductor bodies and a second end electrically connected with the semiconductor substrate.

In accordance with another aspect of the invention, a method is provided for forming a semiconductor structure in a semiconductor wafer including a semiconductor substrate, a semiconductor layer with a plurality of semiconductor bodies, a buried dielectric layer separating the semiconductor substrate from the semiconductor layer, and a plurality of memory cells built in an array on the semiconductor wafer. A plurality of trenches are etched in the semiconductor wafer and a vertical memory cell is built in each trench. The method further includes forming a via extending through one of the semiconductor bodies and the buried dielectric layer and extending into the semiconductor substrate. The method further includes at least partially filling the via with a plug of an electrically conductive material that extends through the buried dielectric layer to define a body contact having a first end electrically connected with the semiconductor body and a second end electrically connected with the semiconductor substrate.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
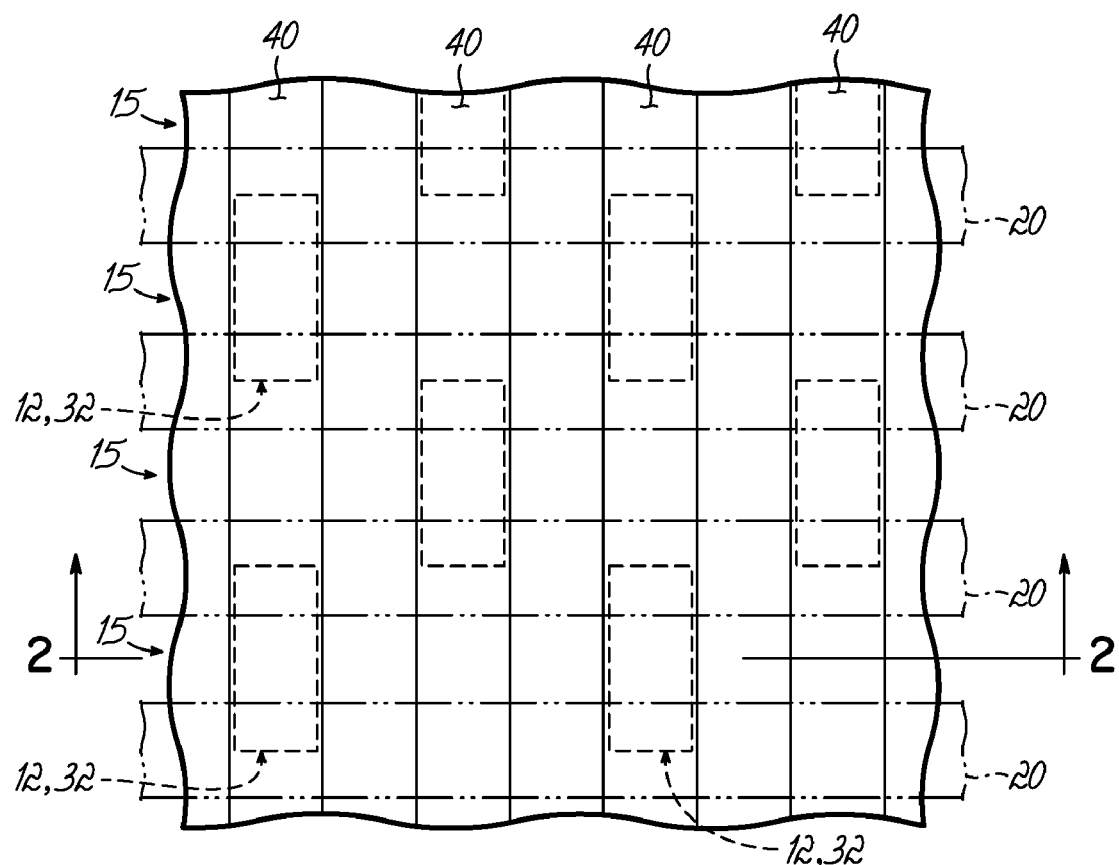
FIG. 1 is a top plan view of an array of vertical memory cells built on a portion of a semiconductor-on-insulator substrate in accordance with an embodiment of the invention.

The present invention provides a semiconductor structure including an array of vertical memory cells built using semiconductor-on-insulator (SOI) technology, as well as methods of making such semiconductor structures. Specifically, the access device for at least one vertical memory cell and, typically, every vertical memory cell in the memory cell array has an associated body contact, which may be high electrical resistance. Each body contact is established through the buried insulating or dielectric layer separating the floating SOI body of an SOI wafer, in which the access device is built, from the underlying semiconductor substrate. Although the invention is not so limited, the present invention may be particularly applicable and beneficial for merged isolation and node trench (MINT) memory cells. The present invention will now be described in greater detail by referring to the drawings that accompany the present application.

Figure 2:
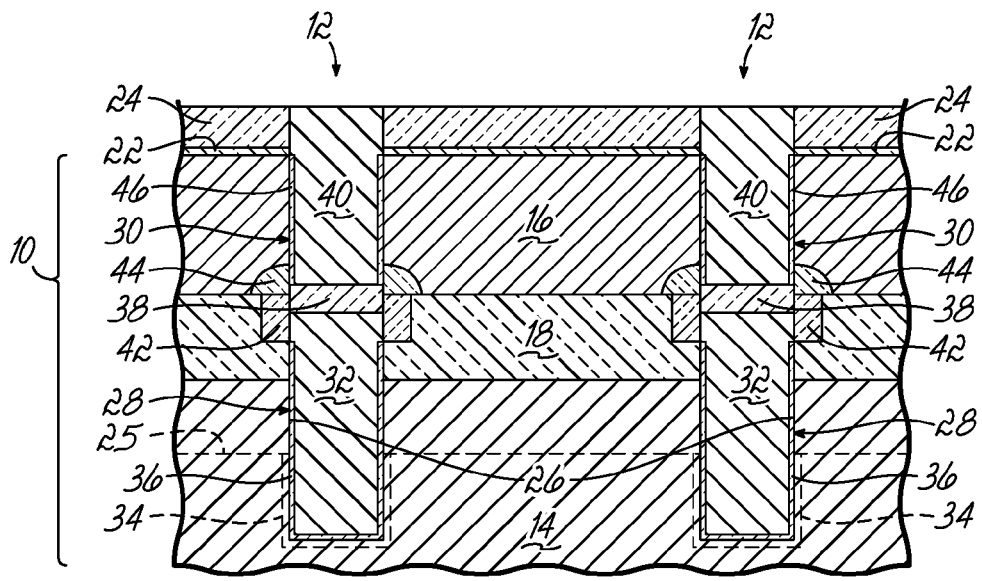
FIG. 2 is a diagrammatic cross-sectional view of the substrate portion of FIG. 1 taken generally along lines 2-2.

With reference to FIGS. 1 and 2, a portion of a semiconductor wafer 10 is shown that includes multiple substantially identical vertical memory cells, generally indicated by reference numeral 12, that are arranged in electrically-isolated pairs of a considerably larger DRAM device built on semiconductor wafer 10. The larger DRAM device may constitute, but is not limited to, a plurality of substantially identical memory cells 12 each having a known eight square feature or 8F2 DRAM cell, as depicted in FIG. 1, and a plurality of substantially identical 8F2 DRAM cells arranged in a larger array across the semiconductor wafer 10. A bit of data can be stored as a data charge in each of the individual 8F2 DRAM cells.

Before building the vertical memory cells 12, SOI semiconductor wafer 10 comprises a semiconductor substrate 14, which is typically a single crystal or monocrystalline bulk silicon substrate, a buried insulating or dielectric layer, illustrated as buried oxide (BOX) layer 18, and a semiconductor or SOI body 16 of a larger SOI layer separated from the semiconductor substrate 14 by the intervening BOX layer 18. The substrate 14 is doped with, for example, a p-type dopant across a layer or region 25 adjacent to the BOX layer 18. The SOI body 16, which is considerably thinner than the semiconductor substrate 14 and is also typically single crystal or monocrystalline silicon, is electrically isolated from the semiconductor substrate 14 by the BOX layer 18. The semiconductor wafer 10 may be fabricated by any suitable conventional technique, such as a wafer bonding technique or a separation by implantation of oxygen (SIMOX) technique, familiar to persons of ordinary skill in the art.

Device isolation regions 20 (FIG. 1) are defined between adjacent rows of vertical memory cells 12 in the cell array, such that the memory cells 12 are paired together. One specific pair of electrically-isolated memory cells 12 is shown in FIG. 2. These device isolation regions 20 may be formed by, for example, a shallow trench isolation (STI) technique that includes a conventional lithography and dry etching process to create trenches followed by filling the trenches with a dielectric material, such as an oxide anisotropically deposited by a high density plasma (HDP) chemical vapor deposition (CVD) process, and then planarization with a conventional chemical mechanical planarization (CMP) process. The device isolation regions 20 partition the SOI body 16 into isolated active area regions or islands 15 on the BOX layer 18 and, thereby, assist in preventing carrier migration between adjacent memory cells 12. Each of the islands 15 may be considered to be used in the construction of a pair of memory cells 12 and, as a result, adjacent pairs of memory cells 12 do not share a common SOI body 16.

A relatively thin pad oxide layer 22 covers an upper horizontal surface of the SOI body 16. The pad oxide layer 22 may be oxide ($SiO_2$) deposited by a conventional thermal CVD process. A relatively thick pad nitride layer 24 covers the pad oxide layer 22. The pad nitride layer 24 may be composed of silicon nitride ($Si_3N_4$) formed by a conventional deposition process, such as CVD or plasma-assisted CVD.

Each of the vertical memory cells 12 is fabricated in a corresponding one of a plurality of trenches 26. Each of the trenches 26 extends through the pad oxide and pad nitride layers 22, 24 and into the semiconductor wafer 10 at locations dispersed across the surface of wafer 10. More specifically, each trench 26, which is formed by a conventional lithography and etching process familiar to a person having ordinary skill in the art, extends through the SOI body 16 and the BOX layer 18 and continues for a depth into region 25 of the semiconductor substrate 14 underlying the BOX layer 18.

Each memory cell 12 includes a storage capacitor 28, typically having the form of a deep trench (DT) capacitor, and an access device 30, typically having the form of a vertical metal oxide semiconductor field-effect transistor, that are disposed within the trench 26 with a vertically stacked arrangement. The access device 30 is electrically coupled with the storage capacitor 28 for allowing the transfer of data charges to and from the storage capacitor 28 during reading and writing operations of the DRAM device. Because the memory cells 12 are substantially identical, the constituent features of one pair of memory cells 12 will be described with the understanding that this description applies to all equivalent pairs of memory cells 12 in the memory cell array and DRAM device.

The storage capacitor 28 of each vertical memory cell 12 is located in a bottom or lower portion of the trench 26. The storage capacitor 28 includes a capacitor node or plate 32 constituted by a conductor, such as doped polycrystalline silicon (i.e., polysilicon). The capacitor plate 32, which includes a portion that projects vertically into the BOX layer 18, is electrically isolated from the SOI body 16 by the BOX layer 18. The capacitor plate 32 may be a heavily n-type doped region defined in the p-type region 25 of the semiconductor substrate 14. Alternatively, the capacitor plate 32 may be doped with a p-type dopant if region 25 is doped with an n-type dopant.

A buried capacitor plate 34 is present in the material of the semiconductor substrate 14 bordering a lower portion of the trench 26. The buried capacitor plate 34 may be heavily doped with, for example, an n-type dopant within the p-type region 25 of the semiconductor substrate 14. Alternatively, the buried capacitor plate 34 may be heavily doped with a p-type dopant if region 25 is doped with an n-type dopant. Buried plate doping may be formed by conventional processes such as out-diffusing a dopant, such as the n-type dopant arsenic, from a layer of doped silicate glass on the sidewall of trench 26, gas phase doping, plasma doping, plasma immersion ion implantation, or any combination of these processes that are well known to a person having ordinary skill in the prior art. Typically, the capacitor plates 32, 34 will be doped with the same type of dopant.

A thin node dielectric 36, which lines the lower portion of trench 26, separates and electrically isolates the buried capacitor plate 34 from capacitor plate 32. The node dielectric 36 may be any suitable dielectric material, including but not limited to silicon oxide, silicon nitride, silicon oxynitride, aluminum oxide, combinations of these dielectric materials, or another high-k material.

With continued reference to FIGS. 1 and 2, the access device 30 of each vertical memory cell 12 is situated in a top or upper portion of the trench 26 and, generally, is stacked vertically above the storage capacitor 28. A trench-top insulator 38, which typically has the form of a trench-top oxide, overlies the capacitor plate 32 vertically and electrically isolates a vertical gate 40 of the access device 30 from the capacitor plate 32. Oxide for the trench-top insulator 38 may be formed in trench 26 above capacitor plate 32 by a suitable conventional process, such as a HDP-CVD process. The vertical gate 40 is constituted by an electrically conductive material, such as polysilicon deposited in the upper portion of trench 26 using low-pressure CVD (LPCVD).

A buried deep strap connection 42 is provided in the BOX layer 18 vertically between the vertical gate 40 and the capacitor plate 32. A lower source/drain region 44 of the access device 30 is defined by dopant outdiffusion from buried deep strap connection 42 that extends into the SOI body 16. The dopant in the lower source/drain region 44 will be, for example, n-type if the dopant in the buried deep strap connection 42 is n-type (e.g., arsenic, phosphorous, or antimony). The source/drain region 44 may operate either as the access device source or as the access device drain contingent upon the operation of access device 30. Capacitor plate 32 of the storage capacitor 28 is tied to the lower source/drain region 44 of the access device 30 and buried capacitor plate 34 is tied to a reference potential or voltage. The buried deep strap connection 42 electrically connects the capacitor plate 32 of the storage capacitor 28 through the lower source/drain region 44 to a vertical channel region 64 (FIG. 9) of the access device 30 when the vertical gate 40 is activated. A thin gate oxide 46, which is formed in a conventional manner, is disposed on the vertical sidewall of trench 26 between the confronting sidewall of the vertical gate 40 and the SOI body 16.

Figure 3:
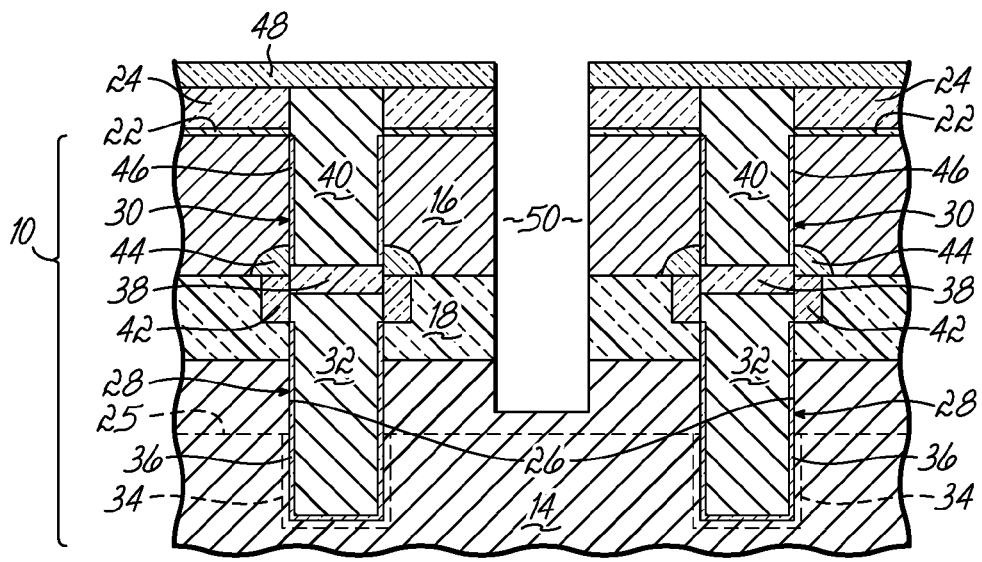
FIGS. 3-12 are diagrammatic cross-sectional views similar to FIG. 2 of the substrate portion at various subsequent fabrication stages.

With reference to FIG. 3 in which like reference numerals refer to like features in FIG. 2 and at a subsequent fabrication stage, a hard mask layer 48 is applied to the pad nitride layer 24 and patterned with body contact vias 50 by any conventional lithography and etching technique that applies a resist layer (not shown), exposes the resist layer to a pattern of radiation defined by a mask, develops the transferred pattern in the exposed resist, and transfers the developed pattern to the hard mask layer 48 with a conventional anisotropic dry etching process, such as reactive-ion etching (RIE) or plasma etching, that stops on the pad nitride layer 24. The hard mask layer 48 may be oxide ($SiO_2$) deposited by a conventional thermal CVD process. An optional etch stop layer (not shown) of, for example, nitride may be provided between the hard mask layer 48 and the pad nitride layer 24 if the hard mask layer 48 is susceptible to removal during subsequent etching processes, as described below. In this instance, the optional etch stop layer would mask the vertical gate 40 during the etching process.

Each of the body contact vias 50 is extended vertically through the pad nitride layer 24 with a conventional anisotropic dry etching process that stops on the pad oxide layer 22, through the pad oxide layer 22 with another anisotropic dry etching process that stops on the SOI body 16, through the SOI body 16 with another conventional anisotropic dry etching process that stops on the BOX layer 18, through the BOX layer 18 with another conventional anisotropic dry etching process that stops on the substrate 14, and into the wafer 10 with a final conventional anisotropic etching process. The chemistry of each etching process, which may be conducted in a single etching step or multiple steps, is chosen according to the material selectivity required. Each of the etch processes relies on the hard mask layer 48 as an etch mask.

Figure 4:
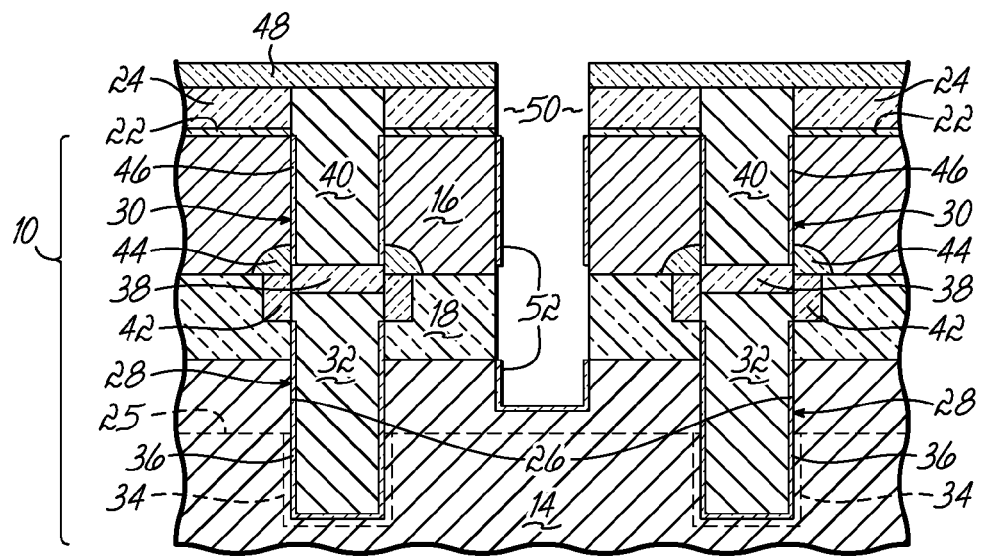

With reference to FIG. 4 in which like reference numerals refer to like features in FIG. 3 and at a subsequent fabrication stage, a spacer 52 of a suitable semiconductor material, like silicon, is selectively formed within each of the body contact vias 50. The spacer 52, which is optional, does not completely cover the entire sidewall of each via 50 but is formed only on the exposed surfaces of the SOI body 16 and the substrate 14 that border each body contact via 50. These exposed surfaces of the substrate 14 and the SOI body 16 operate as seeds for epitaxial growth of the optional spacer 52. The semiconductor material forming the spacer 52 preferably does not form with an appreciable thickness on the vertical surfaces of the BOX layer 18, the pad oxide layer 22, and the pad nitride layer 24 bordering each via 50.

Figure 5:
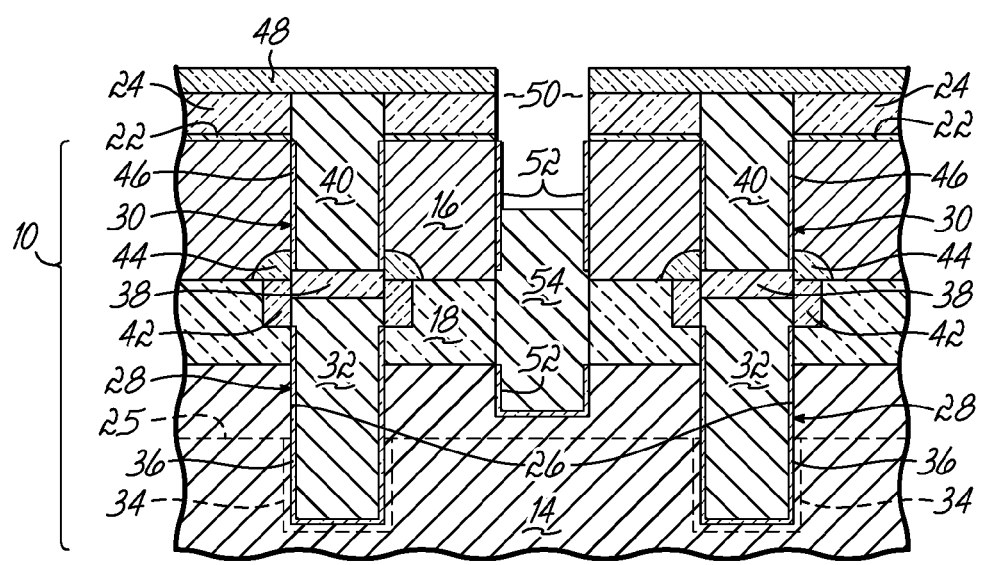

With reference to FIG. 5 in which like reference numerals refer to like features in FIG. 4 and at a subsequent fabrication stage, a layer (not shown) of an electrically conductive fill material is deposited by a conventional process on hard mask layer 48. A body contact 54 is defined by a portion or plug of the deposited conductive fill material that fills each via 50. An optional conventional planarization process, such as chemical mechanical polishing (CMP), may be used to remove excess conductive fill material from hard mask layer 48, which re-exposes the hard mask layer 48. The planarization process stops vertically on the upper horizontal surface of hard mask layer 48. The body contact 54 may be constituted by intrinsic polysilicon or n-type doped polysilicon formed within the p-type region 25 of the semiconductor substrate 14. Alternatively, the buried capacitor plate 34 may consist of p-type doped polysilicon if region 25 is doped with an n-type dopant.

The upper surface of the body contact 54 is recessed below the horizontal level of the hard mask layer 48 by, for example, an anisotropic dry etch process that removes the constituent conductive fill material selective to the constituent material of the hard mask layer 48. In particular, the etch process recesses the body contact 54 to a depth vertically above the depth of the BOX layer 18.

The presence of the optional spacer 52 effectively increases the spacing between the body contact 54 and the buried deep strap connection 42 of the access device 30 by locally thickening the sidewall of via 50. This distances an interface between the body contact 54 and the SOI body 16 further away from the lower source/drain region 44, which advantageously reduces the transfer of leakage current to and from the buried deep strap connection 42 that is directly connected to capacitor plate 32 of the storage capacitor 28. If not abated, such leakage current may be detrimental to the operation of the vertical memory cell 12. Spacer 52 may be omitted if the proximity of the body contact 54 to the lower source/drain region 44 is not a concern in the device design.

Each body contact 54 electrically couples the SOI body 16 of the access device 30 with the semiconductor substrate 14 to define a leaky current path therebetween. Each body contact 54 serves a pair of access devices 30 in a contiguous island 15 of the monocrystalline semiconductor defined by the SOI body 16 on SOI wafer 10. If the body contact 54 is formed from doped polysilicon, the dopant type of the body contact 54 should be the same as the dopant type in the SOI body 16 and the substrate 14 contacted by the body contact 54.

Figure 6:
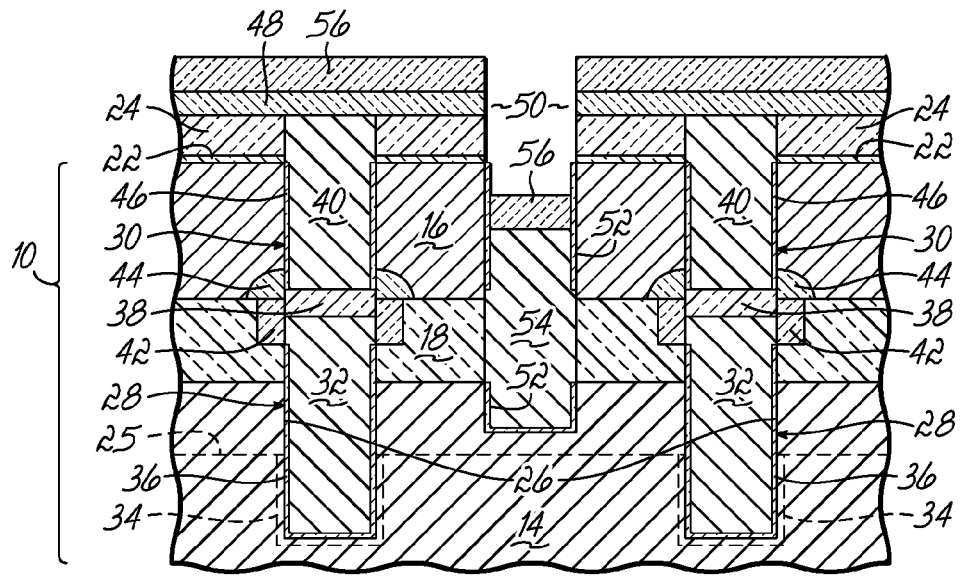

With reference to FIG. 6 in which like reference numerals refer to like features in FIG. 5 and at a subsequent fabrication stage, an insulating layer 56 is formed on the body contact 54. The insulating layer 56 may be, for example, oxide deposited by a conventional HDP CVD oxide process, which deposits oxide on horizontal surfaces preferentially to vertical surfaces like trench sidewalls. Portions of the insulating layer 56 also cover the horizontal surface of hard mask layer 48. Any portions of insulating layer 56 resident on the vertical sidewall of the body contact via 50 above the body contact 54 are stripped by a directional etch back process.

Figure 7:
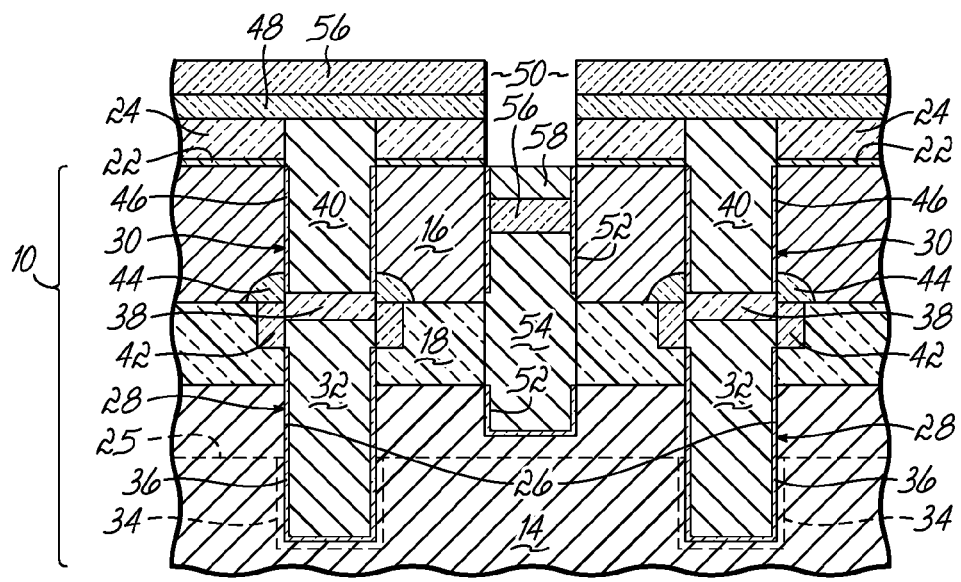

With reference to FIG. 7 in which like reference numerals refer to like features in FIG. 6 and at a subsequent fabrication stage, a layer of a fill material, such as intrinsic polysilicon or polysilicon doped oppositely to the material (e.g., silicon) constituting the SOI body 16, is deposited by a conventional process on insulating layer 56. The dopant type in plug 58 differs from the dopant type in body contact 54. For example, plug 58 may be polysilicon doped with a n-type dopant or intrinsic polysilicon if the body contact 54 is doped with a p-type dopant and the region 25 is also p-type.

A portion of the fill material fills each body contact via 50 with a plug 58 above the portion of the insulating layer 56 in via 50. A conventional planarization process, such as CMP, is used to remove excess fill material from the insulating layer 56 on the hard mask layer 48, which re-exposes the insulating layer 56. The planarization process stops vertically on the upper horizontal surface of insulating layer 56. The upper surface of the plug 58 in each body contact via 50 is recessed by, for example, an anisotropic dry etch process that removes the constituent fill material of plug 58 selective to the material constituting the hard mask layer 48. In particular, the etch process recesses the plug 58 vertically to a depth within each body contact via 50 approximately level with the pad oxide layer 22.

Figure 8:
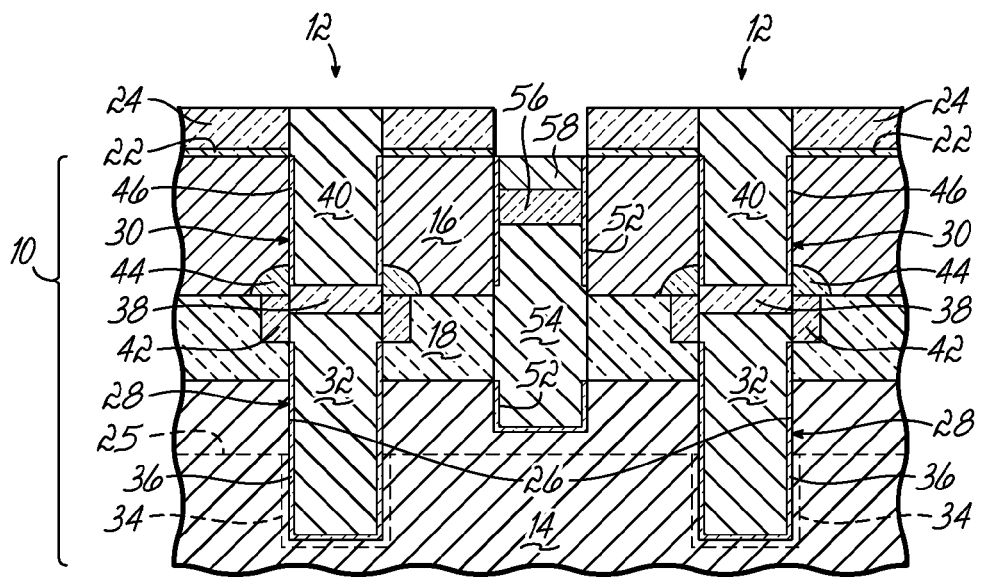

With reference to FIG. 8 in which like reference numerals refer to like features in FIG. 7 and at a subsequent fabrication stage, the hard mask layer 48 and the insulating layer 56 are removed by a conventional planarization process, such as one or more CMP processes, that stops vertically on the pad nitride layer 24. As a result, the respective upper surfaces of each vertical gate 40 and the pad nitride layer 24 are exposed.

Figure 9:
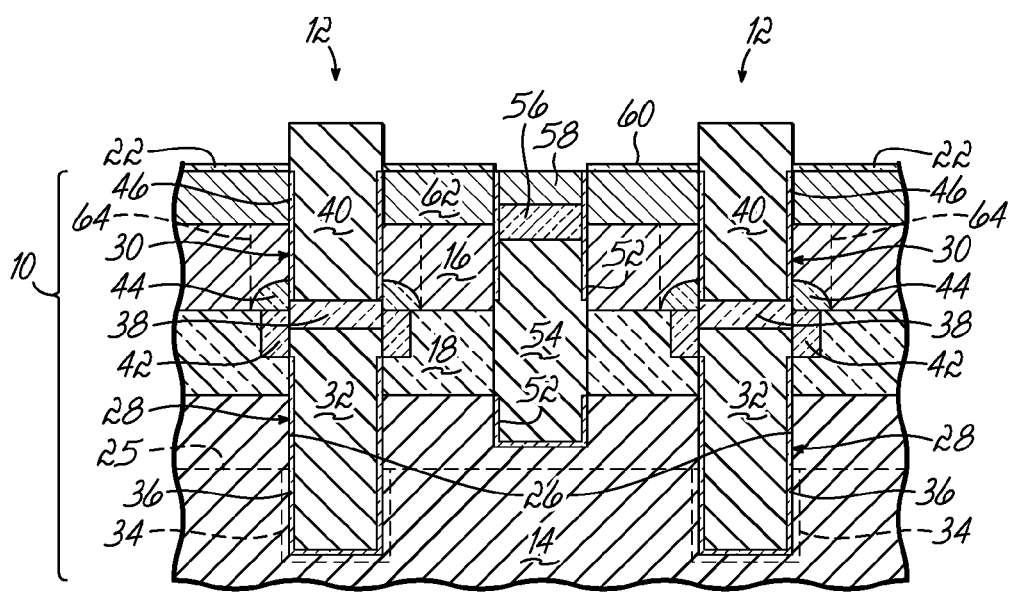

With reference to FIG. 9 in which like reference numerals refer to like features in FIG. 8 and at a subsequent fabrication stage, the pad nitride layer 24 is stripped by an etch process that removes the material of the pad nitride layer 24 selective to the material constituting pad oxide layer 22. For example, a wet isotropic etch process using hot acid, such as phosphoric acid, may be employed to remove $Si_3N_4$ relative to oxide. An upper horizontal surface 60 of the pad oxide layer 22 is exposed after the pad nitride layer 24 is removed. The upper end of each conductive plug 58 projects vertically above the horizontal level of surface 60.

An upper source/drain region 62 is defined by a doped region in an upper region of the SOI body 16. For example, the upper source/drain region 62 may be formed by implantation or diffusion of an n-type dopant, such as arsenic or phosphorous, into the SOI body 16 and plugs 58, if these regions are doped with a p-type dopant. The upper source/drain region 62 operates as either a source or a drain of the access device 30, contingent upon the operation of access device 30. The plug 58 in each body contact via 50 and portions of spacer 52 between each plug 58 and the adjacent SOI body 16 participate, when doped, along with the SOI body 16 to make the source/drain region 62 laterally continuous and unbroken. In particular, the interface between the doped plug 58 and the SOI body 16 make the source/drain region 62 continuous across the body contact 54 by bridging the body contact via 50.

A vertical channel region 64 is defined in the SOI body 16 near the vertical gate 40 and generally between the source/drain regions 44, 62 of the access device 30. Current flowing through channel region 64 between the source/drain regions 44, 62 is controlled or switched by potential or voltage applied to the vertical gate 40. When the access device 30 is switched "on" by application of a suitable voltage to the vertical gate 40, channel region 64 becomes electrically conductive to allow current flow between the source/drain regions 44, 62. The access device 30 is considered by a person having ordinary skill in the art to constitute a vertical device structure because of the three-dimensional vertical arrangement of the vertical gate 40, the channel region 64, and the source/drain regions 44, 62.

Figure 10:
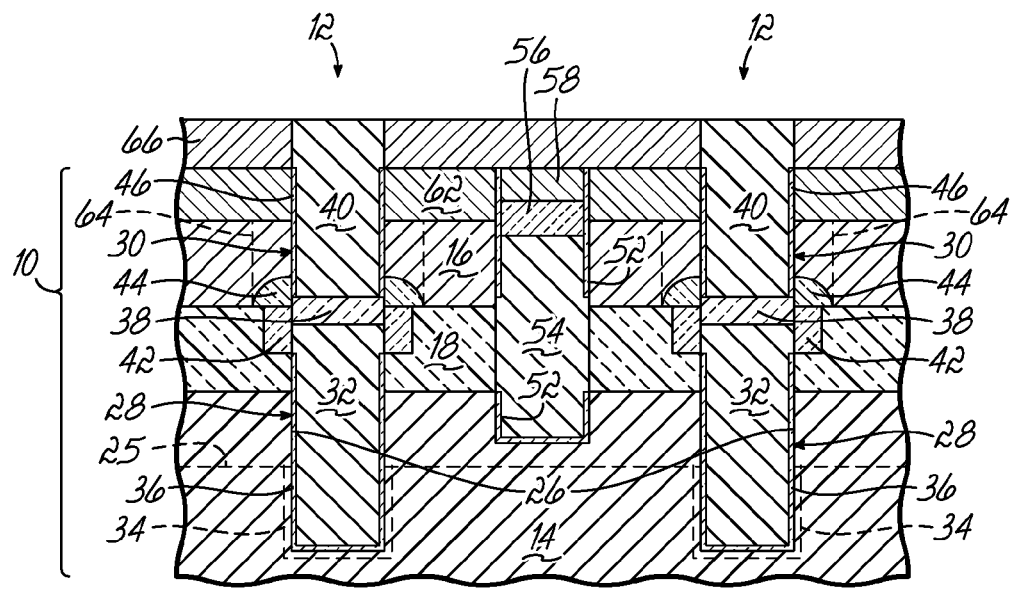

With reference to FIG. 10 in which like reference numerals refer to like features in FIG. 9 and at a subsequent fabrication stage, the remnants of pad oxide layer 22 are stripped utilizing a conventional etching process that removes the material of layer 22 with a high selectively to the material constituting the SOI body 16 (e.g., silicon). An array top insulator 66 is formed on the source/drain region 62. The array top insulator 66 may be formed, for example, by depositing oxide using a conventional HDP CVD oxide process and optionally planarizing with a conventional planarization process, such as a CMP process, that stops vertically on the vertical gate 40. The body contact 54 is buried by the material of the array top insulator 66.

Figure 11:
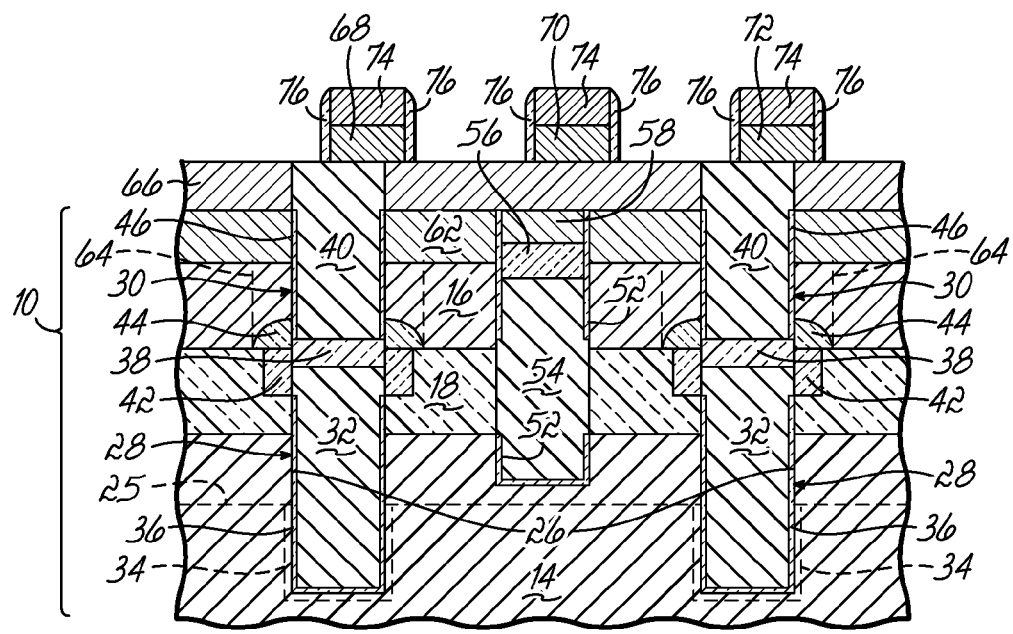

With reference to FIG. 11 in which like reference numerals refer to like features in FIG. 10 and at a subsequent fabrication stage, a plurality of word lines, including word lines 68, 70, 72 visible in FIG. 10, are formed by a series of processes familiar to a person having ordinary skill in the art. The array top insulator 66 operates to electrically isolate the source/drain region 62 from word lines 68, 70, 72. Each of the word lines 68, 70, 72 consists of one or more conducting layers constituted by a conductor, such as polysilicon, tungsten nitride (WN), tungsten (W), tungsten silicide (WSi), or layered combinations of these materials. Each of the word lines 68, 70, 72 includes an electrically-insulating cap 74 of, for example, nitride stationed atop the conducting layer(s), and electrically-insulating sidewall spacers 76 of, for example, nitride flanking the conducting layer(s).

Word line 68 is electrically coupled with the storage capacitor 28 of one vertical memory cell 12 visible in FIG. 11 by the underlying access device 30. A potential applied from word line 68 to vertical gate 40 controls the data charge on the storage capacitor 28 by selectively transferring current between the source/drain regions 44, 62 through the corresponding channel region 64 in the SOI body 16. Similarly, word line 72 is electrically coupled with the storage capacitor 28 of the other memory cell 12 visible in FIG. 11 by the underlying access device 30. A potential applied from word line 72 to the vertical gate 40 of the access device 30 of this memory cell 12 likewise controls the data charge on the corresponding storage capacitor 28 by selectively transferring current between the source/drain regions 44, 62 through the corresponding channel region 64 in the SOI body 16.

To provide the electrical coupling, the vertical gate 40 of each access device 30 for the exemplary pair of vertical memory cells 12 visible in FIG. 11 is contacted by one of the word lines 68, 72. As a consequence, these word lines 68, 72 are referred to as active word lines. The other word line 70 does not contact either of the memory cells 12 visible in FIG. 11 and is referred to as a passing word line. This word line 70, which is passing in FIG. 11, is connected with the access device 30 in other memory cells 12 in the memory cell array (FIG. 1) and in the DRAM device. Similarly, word lines 68, 72, which are active in FIG. 11, are not connected with the access device 30 of certain other memory cells 12 in the memory cell array (FIG. 1) and in the DRAM device. Consequently, as appreciated by a person having ordinary skill in the art, ascribing the terms active and passing to the word lines 68, 70, 72 depends upon which specific pair of word lines 68, 70, 72 is coupled with each electrically-isolated pair of memory cells 12 in the memory cell array and DRAM device. The body contact via 50 and body contact 54 are formed in a region of the SOI semiconductor wafer 10 that directly underlies the passing word line 70.

Figure 12:
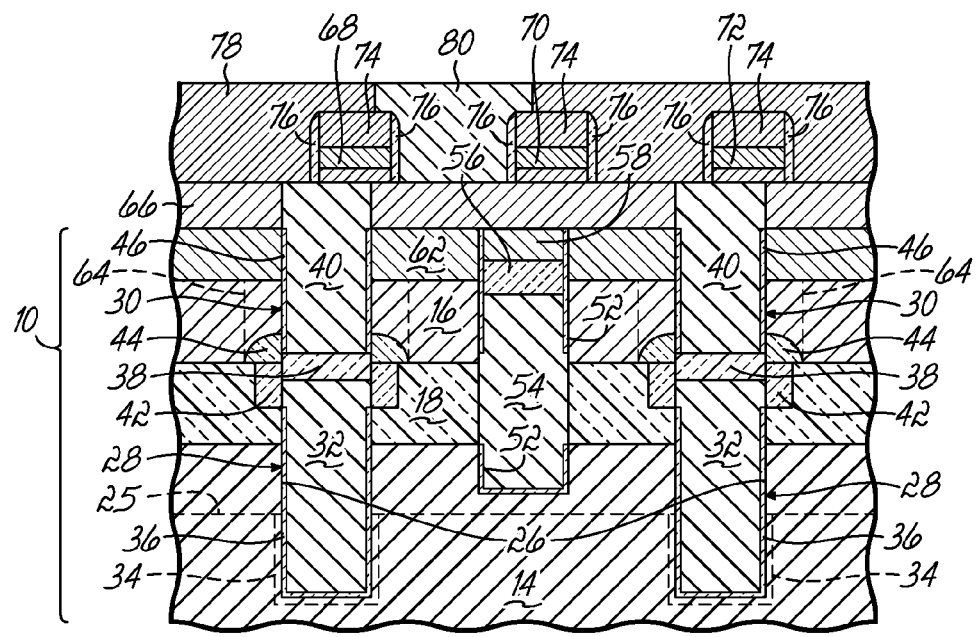

With reference to FIG. 12 in which like reference numerals refer to like features in FIG. 11 and at a subsequent fabrication stage, a layer 78 of a suitable gap fill material, such as oxide or borophosphosilicate glass (BPSG) is deposited and planarized to fill gaps between adjacent pairs of word lines 68, 70, 72. The material of the gap fill layer 78 is planarized by a conventional planarization process, such as a CMP process, to establish an upper horizontal surface by relying on caps 74 as a polish stop.

Bit line contacts 80, each consisting of a conductive material like metal or polysilicon, are then formed using conventional bit line formation techniques. Each bit line contact 80 extends through the gap fill layer 78 to establish an electrical contact with the corresponding source/drain region 62. For example, the bit line contacts 80 may be formed by depositing a resist layer on gap fill layer 78, patterning the resist layer to form a bit line contact pattern, etching the unmasked regions of the gap fill layer 78 by an etching process that removes the constituent material of layer 78 selective to the constituent material of SOI body 16 to form bit line contact vias to the source/drain region 62, removing the resist layer, depositing a blanket layer of a conductive material suitable for forming contacts 80, and planarizing with a conventional process, like a CMP process, to the top of the gap fill layer 78.

Normal processing is used to complete the DRAM integrated circuit, as understood by a person having ordinary skill in the art. Normal processing may include, but is not limited to, deposition of an interlayer dielectric (not shown) such as BPSG or another suitable insulator, formation of bit lines (not shown) that contact the bit line contacts 80, and formation of higher level metallizations (not shown) and insulating layers (not shown).

Figure 13:
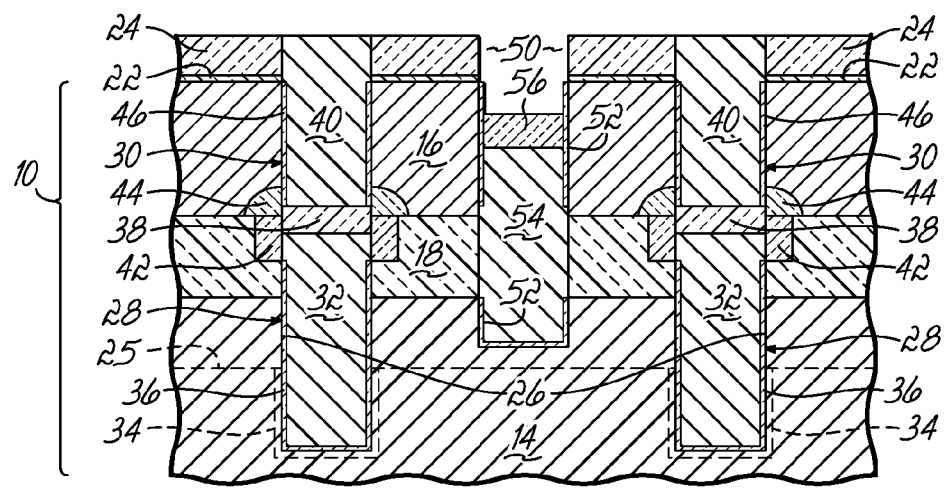
FIG. 13 is a diagrammatic cross-sectional view similar to FIG. 5 in accordance with an alternative embodiment of the invention.

With reference to FIG. 13 in which like reference numerals refer to like features in FIG. 5 and at a subsequent fabrication stage in accordance with an alternative embodiment of the present invention, the insulating layer 56 is formed on the body contact 54 by a conventional thermal CVD process, such as an oxide CVD process. Portions of the insulating layer 56 also cover the horizontal surface of hard mask layer 48. The insulating layer 56 overlying the body contact 54 is recessed by an appropriate process to a depth approximately level with pad oxide layer 22. For example, the insulating layer 56 may be recessed using an oxide wet (HF-based) etch or a dry RIE process appropriate to etch an oxide constituting insulating layer 56. The process that recesses the insulating layer 56 covering the body contact 54 also removes the residue of layer 56 on the hard mask layer 48 (FIG. 5) and also removes the remnants of the hard mask layer 48.

Processing continues with the fabrication stage of FIG. 8 by depositing a fill material, such as intrinsic polysilicon or doped polysilicon (e.g., $n^+$ polysilicon), similar to the material constituting the SOI body 16 on pad nitride layer 24 and planarizing with a conventional planarization process, such as a CMP process, that stops vertically on the upper horizontal surface of pad nitride layer 24, to form plugs 58. The upper surface of each plug 58 is recessed by, for example, an anisotropic dry etch process that removes the constituent fill material of plug 58 selective to the constituent material of the hard mask layer 48. In particular, the etch process recesses the plug 58 vertically to a depth approximately level with the pad oxide layer 22.

Figure 14:
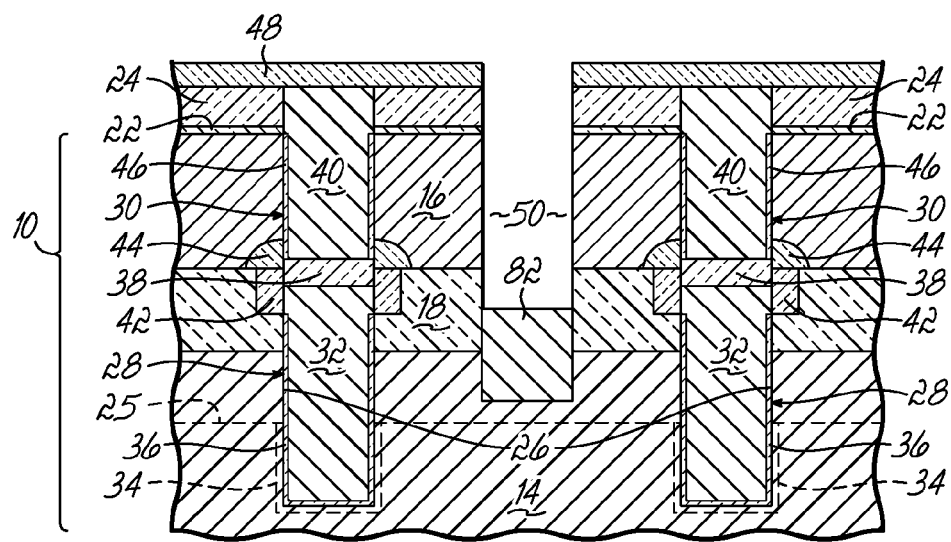
FIGS. 14-16 are diagrammatic cross-sectional views subsequent to the fabrication stage of FIG. 3 of the substrate portion at various subsequent fabrication stages in accordance with an alternative embodiment of the invention.

With reference to FIG. 14 in which like reference numerals refer to like features in FIG. 3 and at a subsequent fabrication stage in accordance with another alternative embodiment of the present invention, a region or plug 82 of a material, such as intrinsic polysilicon or polysilicon doped similar to the material (e.g., silicon) constituting the substrate 14, is formed in each of the body contact vias 50. For example, plug 82 may be heavily doped with a p-type dopant if region 25 of the substrate 14 has a p-type conductivity. The plug 82 may be formed in each body contact via 50 by depositing a blanket layer of the constituent material, planarizing with a conventional process, such as CMP, that stops vertically on the hard mask layer 48, and etching with, for example, an anisotropic dry etch process that removes the material constituting plug 82 selective to the constituent material of hard mask layer 48. The etching process recesses the upper surface of the plug 82 inside each body contact via 50 vertically to a depth below the interface between the SOI body 16 and the BOX layer 18.

Figure 15:
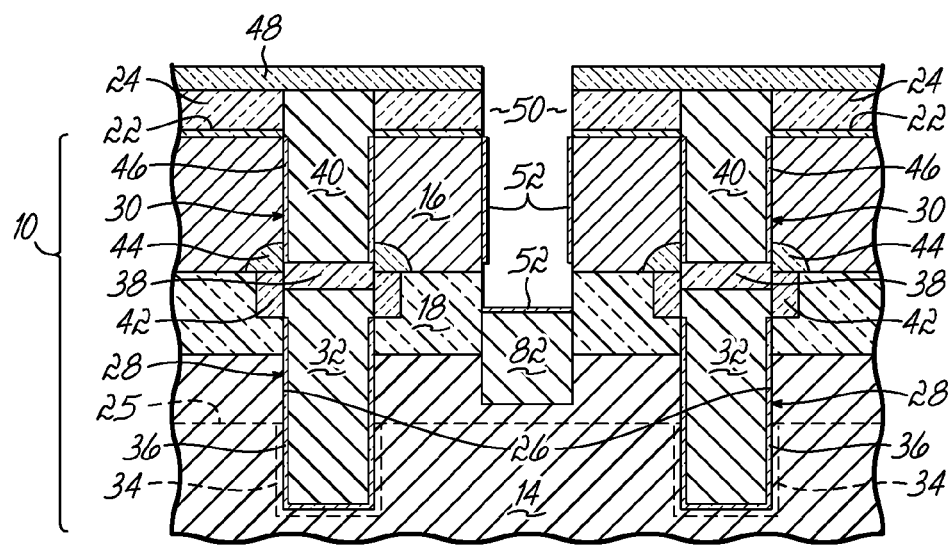

With reference to FIG. 15 in which like reference numerals refer to like features in FIG. 14 and at a subsequent fabrication stage, the spacer 52 is selectively formed within each of the body contact vias 50 and covers the exposed sidewalls of the SOI body 16. However, instead of lining the body contact via 50 at a level below the interface between the substrate 14 and BOX layer 18, a portion of the spacer 52 nucleates on the upper surface of plug 82 and covers plug 82 with an overlying relationship.

Figure 16:
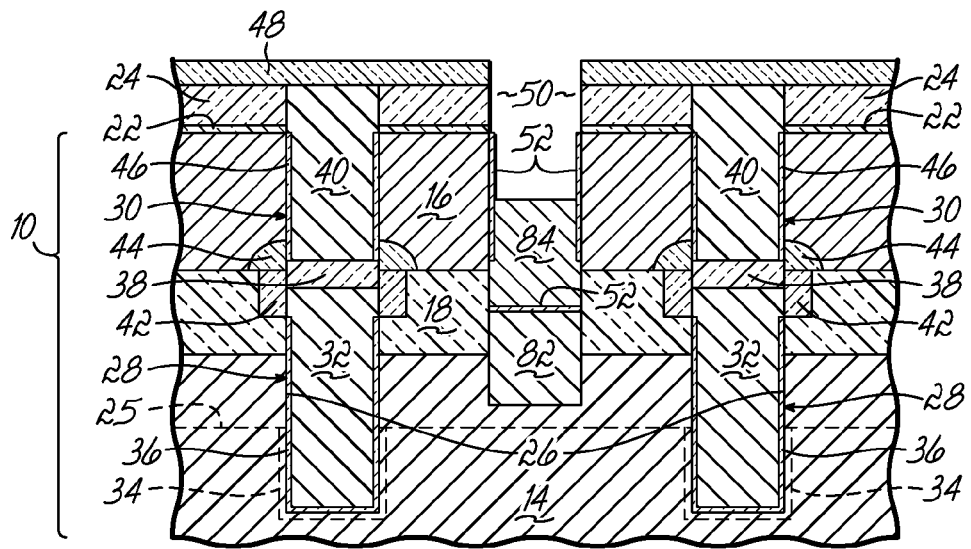

With reference to FIG. 16 in which like reference numerals refer to like features in FIG. 15 and at a subsequent fabrication stage, another region or plug 84 is formed in each of the body contact vias 50 above the portion of the spacer 52 covering plug 82. Plug 84 may be formed from the same material and by a similar process as plug 82. For example, the plug 84 may be intrinsic polysilicon or polysilicon heavily doped with a p-type dopant if plug 82 is intrinsic polysilicon or polysilicon heavily doped with a p-type dopant. The plug 84 may be formed in each of the body contact vias 50 by depositing a blanket layer of the constituent material, planarizing with a conventional process, such as CMP, that stops vertically on the hard mask layer 48, and etching with, for example, an anisotropic dry etch process that removes the constituent material of plug 84 selective to the constituent material of hard mask layer 48. The upper surface of the plug 84 in each body contact via 50 is recessed vertically by the etching process such that the upper surface of plug 84 is at a depth above the interface between the SOI body 16 and the BOX layer 18 and below the interface between the SOI body 16 and the pad oxide layer 22.

The plugs 82, 84 in each of the body contact vias 50 and the portion of the spacer 52 between the plugs 82, 84 collectively constitute a conductive structure that operates as a body contact equivalent functionally to the body contact 54 (FIG. 5). Processing continues in this alternative embodiment beginning at the fabrication stage shown in FIG. 6.

Figure 17:
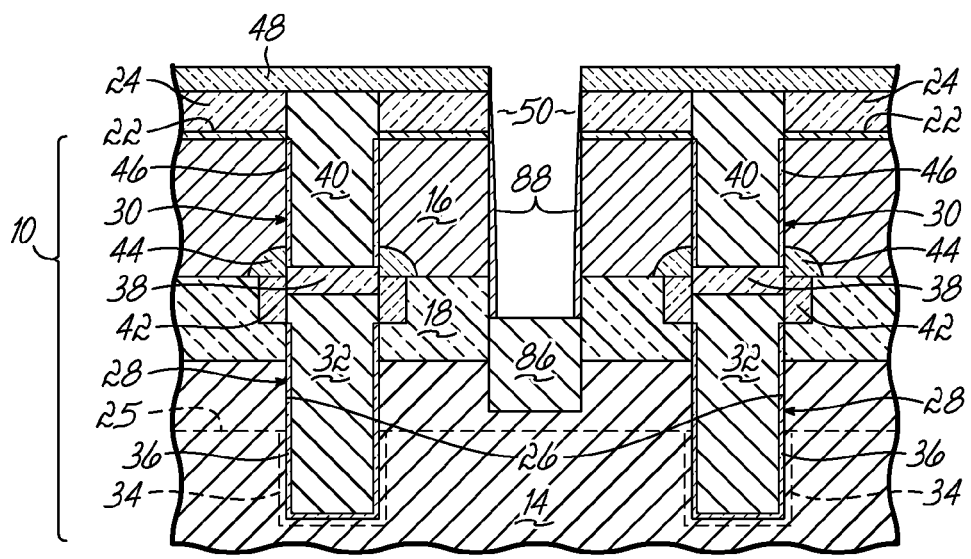
FIGS. 17-19 are diagrammatic cross-sectional views subsequent to the fabrication stage of FIG. 3 of the substrate portion at various subsequent fabrication stages in accordance with an alternative embodiment of the invention.

With reference to FIG. 17 in which like reference numerals refer to like features in FIG. 3 and at a subsequent fabrication stage in accordance with yet another alternative embodiment of the present invention, a region or plug 86 of a material, such as intrinsic polysilicon or polysilicon doped similar to the material (e.g., silicon) constituting the substrate 14, is formed in each of the body contact vias 50. For example, the plug 86 may be heavily doped with a p-type dopant if region 25 of the substrate 14 has a p-type conductivity. The plugs 86 may be formed by depositing a blanket layer of the constituent material, planarizing with a conventional process, such as a CMP process, that stops vertically on the hard mask layer 48, and etching with, for example, an anisotropic dry etch process that removes the constituent material of plug 86 selective to the constituent material of hard mask layer 48. The upper surface of each plug 86 is recessed vertically by the etch process such that the upper surface of plug 86 is at a depth below the interface between the SOI body 16 and the BOX layer 18.

Next, an isolation spacer or collar 88 of an insulating or dielectric material is formed on the exposed sidewall of each body contact via 50 by a conventional process. For example, isolation collar 88 may be formed from oxide deposited by a conformal CVD process and etched using a dry etching process, such as an RIE, that removes the constituent material of the isolation collar 88 selective to the material constituting the plug 86.

Figure 18:
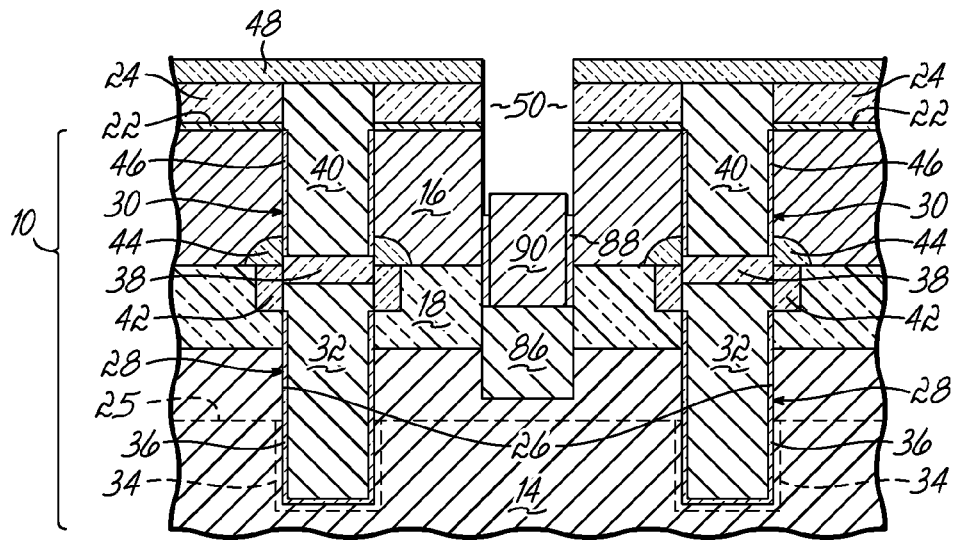

With reference to FIG. 18 in which like reference numerals refer to like features in FIG. 17 and at a subsequent fabrication stage, a region or plug 90 of a material similar or identical to the material constituting plug 86 is formed in each body contact via 50 to define a cap above plug 86. For example, the plug 90 may be polysilicon heavily doped with a p-type dopant if plug 86 is polysilicon also heavily doped with a p-type dopant. Similar to plug 86, plug 90 may be formed in each body contact via 50 by deposited by depositing a blanket layer of the constituent material, planarizing with a conventional process, such as CMP, that stops vertically on the hard mask layer 48, and etching with, for example, an anisotropic dry etch process that removes the constituent material of plug 90 selective to the constituent material of hard mask layer 48. The upper surface of the plug 90 in each of the body contact vias 50 is recessed vertically by the etching process such that the upper surface of plug 90 is at a depth above the interface between the SOI body 16 and the BOX layer 18.

A portion of the isolation collar 88 projecting vertically above the plug 90 is removed by an etch process, such as a wet isotropic etch process, that removes the material of isolation collar 88 selective to the material constituting plug 90. The etching process is continued to recess the isolation collar 88 vertically below the upper surface of plug 90. Plug 90 lies within the body contact via 50 at a location radially inside of the isolation collar 88.

Figure 19:
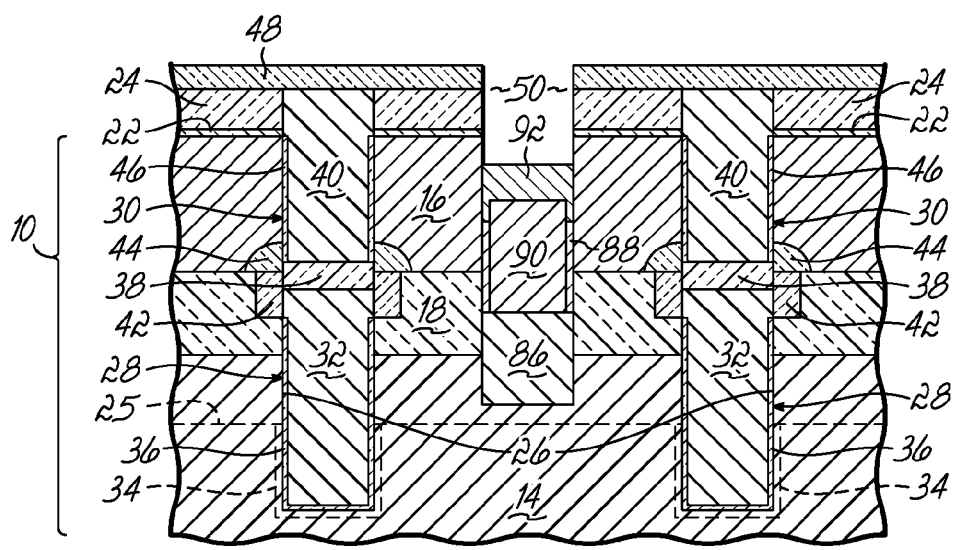

With reference to FIG. 19 in which like reference numerals refer to like features in FIG. 18 and at a subsequent fabrication stage, a region or plug 92 of a material similar to the material constituting plugs 86 and 90 is formed in each body contact via 50 above plug 90. For example, plug 92 may be heavily doped with a p-type dopant if plugs 86 and 90 are polysilicon heavily doped with a p-type dopant. Similar to plugs 86 and 90, plug 92 may be formed in each body contact via 50 by depositing a blanket layer of the constituent material, planarizing with a conventional process, such as CMP, that stops vertically on the hard mask layer 48, and etching with, for example, an anisotropic dry etch process that removes the constituent material of plug 92 selective to the constituent material of hard mask layer 48. The upper surface of plug 92 is recessed vertically by the etch process such that the upper surface of plug 92 is at a depth below the interface between the SOI body 16 and the pad oxide layer 22.

The plugs 86, 90, 92 collectively constitute a body contact that is structurally equivalent functionally to the body contact 54 (FIG. 5). Specifically, plug 86 is electrically coupled with the substrate 14, plug 92 is electrically coupled with the SOI body 16, and plug 90 electrically couples plug 86 with plug 92 to structurally comprise the body contact 54. Processing continues in this alternative embodiment beginning at the fabrication stage shown in FIG. 6.

The isolation collar 88 provides an intervening structure that prevents any interactions between the material of the SOI body 16 and the body contact 54 defined by plugs 86, 90, 92 and effectively provides a buffer region so that the SOI body 16 and the body contact 54 lack an interface. This is particularly beneficial in situations in which the SOI body 16 is single crystal silicon and the plugs 86, 90, 92 are constituted by polysilicon because defects in the polysilicon tend to propagate into the single crystal silicon. The isolation collar 88 also operates to distance the plugs 86, 90, 92 from the buried deep strap connection 42.

It should be noted that embodiments of the present invention are described herein with semiconductor structures being doped for a particular device type, i.e. n-type FET's (N-channel FET's). However, the invention is not so limited as a person having ordinary skill would understand how to replace N-channel FET's with p-type FET's (P-channel FET's) and n-type dopant with p-type dopant (e.g., boron or indium) where appropriate without departing from the spirit or scope of the invention.

The present invention provides various advantages in comparison with the construction of conventional DRAM cell arrays. In particular, the present invention provides for ultra-scalable and high performance SOI vertical array DRAM device having a high-resistance body contact to potentially eliminate and, at the least, significantly reduce the floating body effect by providing a conduction or leakage path through the BOX layer 18 from the SOI body 16 to the semiconductor substrate 14. The beneficial result is that the leakage current from storage capacitor 28, arising from diffusion of charge carriers to this interface, is significantly reduced. The present invention is compatible with the current DRAM and enhanced dynamic random access memory (eDRAM) processes. The present invention is easy to implement in a circuit design and cost-effective, which is beneficial for purposes of manufacturability.

References herein to terms such as "vertical", "horizontal", etc. are made by way of example, and not by way of limitation, to establish a frame of reference. The term "horizontal" as used herein is defined as a plane parallel to the conventional plane or surface of semiconductor wafer 10, before processing and regardless of the actual spatial orientation of semiconductor wafer 10. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and methods, and illustrative examples shown and described. Accordingly, departures may be made from such details without departing from the spirit or scope of applicants' general inventive concept.

What is claimed is:

1. A method for forming a semiconductor structure in a semiconductor wafer including a semiconductor substrate, a semiconductor layer with a plurality of semiconductor bodies, and a buried dielectric layer separating the semiconductor substrate from the semiconductor layer, the method comprising:

building a plurality of vertical memory cells each in a corresponding one of a plurality of trenches in the semiconductor wafer;

after building the vertical memory cells, forming a via extending through one of the semiconductor bodies and the buried dielectric layer and extending into the semiconductor substrate; and at least partially filling the via with a first plug of an electrically conductive material that extends through the buried dielectric layer to define a body contact having a first end electrically connected with the semiconductor body and a second end electrically connected with the semiconductor substrate.

2. The method of claim 1 wherein the vertical memory cells further include a first vertical memory cell and a second vertical memory cell adjacent to the first vertical memory cell, and further comprising:

forming an insulating layer on the semiconductor body; and building a plurality of word lines on the semiconductor wafer including a first word line on the insulating layer between the first and second memory cells and electrically isolated from the first and second memory cells, the first word line aligned vertically with the body contact.

3. The method of claim 2 wherein the plurality of word lines further includes a second word line connected with an access device of the first vertical memory cell and a third word line connected with an access device of the second vertical memory cell, the second and third word lines electrically isolated from the first word line.

4. The method of claim 1 further comprising:

forming a sidewall spacer within the via that separates the body contact from the semiconductor body.

5. The method of claim 4 wherein forming the sidewall spacer further comprises:

forming an epitaxial layer on a portion of the semiconductor body bordering the via.

6. The method of claim 4 wherein forming the sidewall spacer further comprises:

forming an isolation collar of an insulating material on a portion of the semiconductor body bordering the via and surrounding a portion of the body contact.

7. The method of claim 1 further comprising:

forming an insulating layer in the via above the first plug defining the body contact; and forming a second plug of a semiconductor material within the via and separated from the first plug by the insulating layer, the second plug having an interface within said via with the semiconductor body.

8. The method of claim 7 wherein each of the vertical memory cells includes an access device with a first source/drain region and a storage capacitor electrically coupled by the first source/drain region with the access device, and further comprising:

introducing a dopant into the semiconductor body and the second plug to define a second source/drain region for the access device of each of the vertical memory cells.

9. The method of claim 7 wherein the electrically conductive material of the first plug is a semiconductor material doped with a concentration of a p-type dopant and the semiconductor material in the second plug is doped with a concentration of an n-type dopant.

10. The method of claim 9 wherein the semiconductor material of the first plug is polysilicon doped with the p-type dopant and the semiconductor material of the second plug is polysilicon doped with the n-type dopant.

11. The method of claim 7 wherein the electrically conductive material of the first plug is polysilicon, and the semiconductor material of the first plug is polysilicon doped oppositely to the polysilicon in the second plug.

12. The method of claim 1 wherein each of the vertical memory cells includes a storage capacitor and an access device with a vertical channel region defined in one of the semiconductor bodies and a gate configured to switch current flow through the vertical channel region to the storage capacitor.

13. The method of claim 1 wherein forming the via further comprises:

etching the via into the semiconductor wafer.

14. The method of claim 1 wherein the vertical memory cells are arranged in an array, and the body contact is inside the array.

15. The method of claim 14 wherein the array is an eight square feature DRAM cell.

* * * * *